United States Patent
Kleine Jaeger et al.

(10) Patent No.: US 9,396,833 B2
(45) Date of Patent: *Jul. 19, 2016

(54) COMPOSITION FOR PRINTING ELECTRODES

(75) Inventors: Frank Kleine Jaeger, Bad Duerkheim (DE); Stephan Hermes, Bad Duerkheim (DE); Juergen Kaczun, Wachenheim (DE)

(73) Assignee: BASF SE, Ludwigshafen (DE)

(*) Notice: Subject to any disclaimer, the term of this patent is extended or adjusted under 35 U.S.C. 154(b) by 897 days.

This patent is subject to a terminal disclaimer.

(21) Appl. No.: 13/394,011

(22) PCT Filed: Sep. 1, 2010

(86) PCT No.: PCT/EP2010/062775
§ 371 (c)(1),
(2), (4) Date: Mar. 2, 2012

(87) PCT Pub. No.: WO2011/026852
PCT Pub. Date: Mar. 10, 2011

(65) Prior Publication Data
US 2012/0161081 A1 Jun. 28, 2012

(30) Foreign Application Priority Data
Sep. 4, 2009 (EP) .................................. 09169548

(51) Int. Cl.
*H01B 1/02* (2006.01)
*H01B 1/22* (2006.01)
*H01L 31/0224* (2006.01)

(52) U.S. Cl.
CPC .. *H01B 1/22* (2013.01); *H01B 1/02* (2013.01); *H01L 31/022425* (2013.01); *Y02E 10/50* (2013.01)

(58) Field of Classification Search
USPC .................... 252/512–515, 506, 500, 519.21, 252/516.32, 519.33; 257/741; 438/98; 136/256; 977/742, 936
See application file for complete search history.

(56) References Cited

U.S. PATENT DOCUMENTS

| | | |
|---|---|---|
| 2006/0289055 A1 | 12/2006 | Sridharan et al. |
| 2009/0001328 A1 | 1/2009 | Konno et al. |
| 2009/0095344 A1* | 4/2009 | Machida et al. ............... 136/252 |
| 2009/0188555 A1* | 7/2009 | Castillo et al. ................ 136/256 |
| 2009/0250106 A1 | 10/2009 | Hayashi et al. |
| 2009/0317940 A1 | 12/2009 | Konno et al. |
| 2010/0078603 A1 | 4/2010 | Konno et al. |
| 2011/0014492 A1 | 1/2011 | Joshi et al. |
| 2011/0086231 A1 | 4/2011 | Lochtman et al. |
| 2011/0151614 A1 | 6/2011 | Lochtman et al. |
| 2011/0168045 A1 | 7/2011 | Bruchmann et al. |
| 2011/0292159 A1 | 12/2011 | Kleine Jaeger et al. |
| 2011/0298878 A1 | 12/2011 | Kleine Jaeger et al. |
| 2011/0310205 A1 | 12/2011 | Kleine Jaeger et al. |

FOREIGN PATENT DOCUMENTS

| | | |
|---|---|---|
| EP | 1 775 759 | 4/2007 |
| EP | 1 887 106 | 2/2008 |
| EP | 1887106 * | 2/2008 |
| JP | 2008-135416 A | 6/2008 |
| JP | 2008-235846 * | 10/2008 |
| WO | 03 074278 | 9/2003 |
| WO | 2006 132766 | 12/2006 |
| WO | WO2006/132766 * | 12/2006 |
| WO | 2007 089273 | 8/2007 |
| WO | 2010 069902 | 6/2010 |

OTHER PUBLICATIONS

U.S. Appl. No. 13/380,259, filed Feb. 16, 2012, Kleine Jaeger, et al.
U.S. Appl. No. 13/391,779, filed Feb. 22, 2012, Kleine Jaeger, et al.
U.S. Appl. No. 13/394,008, filed Mar. 2, 2012, Kleine Jaeger, et al.
International Search Report Issued Feb. 1, 2011 in PCT/EP10/62775 Filed Sep. 1, 2010.

* cited by examiner

*Primary Examiner* — Monique Peets
(74) *Attorney, Agent, or Firm* — Oblon, McClelland, Maier & Neustadt, L.L.P.

(57) ABSTRACT

The invention relates to a composition for printing electrodes on a substrate, comprising 30 to 90% by weight of electrically conductive particles, 0 to 7% by weight of glass frit, 0.1 to 5% by weight of at least one absorbent for laser radiation, 0 to 8% by weight of at least one matrix material, 0 to 8% by weight of at least one organometallic compound, 3 to 50% by weight of water as a solvent, 0 to 65% by weight of at least one retention aid and 0 to 5% by weight of at least one additive, based in each case on the total mass of the composition. The invention further relates to a use of the composition.

19 Claims, No Drawings

COMPOSITION FOR PRINTING ELECTRODES

The invention relates to a composition for printing electrodes on a substrate, said composition comprising electrically conductive particles, glass frit and solvent.

Compositions which comprise electrically conductive particles and glass frit dispersed in a solvent are used especially in order to print electrodes on semiconductor substrates. Semiconductor substrates printed in this way are used, for example, as solar cells.

To produce the electrodes, the composition is applied to the substrate by a customary printing process. Suitable printing processes are, for example, inkjet printing or laser printing.

The electrically conductive particles present in the composition are generally silver particles. These may be in platelet form or in spherical form. Mixtures of silver particles in platelet form and spherical form are also known. To establish the viscosity needed for printing, the composition comprises a solvent. Organic solvents are typically used. However, this has the disadvantage that the solvent escapes from the composition in the course of further processing after the printing, and thus gets into the environment.

In order that the composition does not run, a polymer material is typically also present, with which the composition is initially bound to the semiconductor material. After the printing, the composition is generally fired. In the course of firing, the polymer material decomposes and is removed from the conductor tracks. The glass frit present in the composition melts and binds the imprinted conductor tracks comprising the electrically conductive particles to the substrate.

A composition in paste form which can be used to produce a light-receiving surface electrode of a solar cell is described, for example, in WO 2007/089273. The paste comprises silver particles with a specific surface area of 0.2 to 0.6 $m^2/g$, glass frit, resin binders and diluent. The diluent used is an organic solvent.

A composition which comprises silver powder with two different mean diameters is described in EP-A 1 775 759. In addition to the silver powder, the composition likewise comprises glass frit and an organic carrier. The proportion of silver in the electrode material is 75 to 95% by weight.

A paste for producing electrodes from solar cells, which comprises 85 to 99% by weight of a conductive metal component and 1 to 15% by weight of a glass component, and also an organic component, is described in WO 2006/132766.

However, a disadvantage of this known composition is that the organic substances present therein are released both in the course of drying after the application of the composition and in the course of firing.

It is therefore an object of the present invention to provide a composition for printing electrodes, in which less organic material is released to the environment in the course of drying and firing.

The object is achieved by a composition for printing electrodes on a substrate, comprising 30 to 90% by weight of electrically conductive particles, 0 to 7% by weight of glass frit, 0.1 to 5% by weight of at least one absorbent for laser radiation, 0 to 8% by weight of at least one matrix material, 0 to 8% by weight of at least one organometallic compound, 3 to 50% by weight of water as a solvent, 0 to 65% by weight of at least one retention aid and 0 to 5% by weight of at least one additive, based in each case on the total mass of the composition.

The inventive composition is especially suitable for printing electrodes by a laser printing process.

The use of water as a solvent reduces the proportion of organic substances which are released to the environment in the course of drying and firing of the composition for producing the electrodes. This allows the environmental pollution in the production of the solar cells to be reduced.

The electrically conductive particles present in the composition may be particles of any geometry composed of any electrically conductive material. The electrically conductive particles present in the composition preferably comprise silver, gold, aluminum, platinum, palladium, tin, nickel, cadmium, gallium, indium, copper, zinc, iron, bismuth, cobalt, manganese, chromium, vanadium, titanium or mixtures or alloys thereof.

The mean particle size of the particles used is preferably in the range from 3 nm to 100 µm. The mean particle size is more preferably in the range from 100 nm to 50 µm and especially in the range from 500 nm to 10 µm. The particles used may have any desired form known to those skilled in the art. For example, the particles may be in platelet form or spherical form. Spherical particles are also understood to mean those whose real form deviates from the ideal spherical form. For example, spherical particles, as a result of the production, may also have a droplet shape or be truncated. Suitable particles which can be used to produce the composition are known to those skilled in the art and are commercially available. Especially preferably, spherical silver particles are used. The advantage of the spherical particles is their improved rheological behavior compared to platelet-shaped particles. For instance, a composition which comprises spherical particles has a lower viscosity than a composition comprising platelet-shaped particles. In addition, a composition which comprises spherical particles has a significant lowering of viscosity on shear. This also allows high fill levels of up to about 90% to be achieved, in the case of which the composition still remains printable.

If two or more different types of electrically conductive particles are to be used, this can be done by mixing the types. The particles of the different types may differ in material, in form and/or in size.

The proportion of electrically conductive particles in the composition is in the range from 50 to 90% by weight. The proportion is preferably in the range from 70 to 87% by weight and especially in the range from 75 to 85% by weight.

In order to obtain a printable dispersion, the composition comprises solvent. According to the invention, the solvent used is water, which is present in the composition with a proportion of 3 to 20% by weight. The proportion of water in the composition is preferably in the range from 5 to 15% by weight and especially in the range from 6 to 12% by weight.

Since water generally evaporates relatively rapidly, the addition of a retention aid, known as a retardant, is needed in order to slow the evaporation. The retention aid is present in the composition with a proportion of 0 to 65% by weight, preferably with a proportion of 0.5 to 10% by weight and especially with a proportion in the range from 0.8 to 4% by weight.

Suitable retention aids are polar, water-binding solvents. Suitable polar, water-binding solvents are, for example, glycerol, glycols, for example ethylene glycol, propylene glycol, polyglycols such as diethylene glycols, polyethylene glycols (for example PEG200), polypropylene glycol, alkanolamines, for example methyldiethanolamine, ethyldiethanolamine, N-methylpyrrolidone, polyethyleneimines, polyvinylamine, polyvinylformamide or mixtures thereof. Particularly preferred retention aids are glycerol and polyethylene glycols. These have a high surface tension, which reduces running of the composition on the surface of the substrate to be printed. As a result, clearer structures are printable.

In order that the composition does not run before the actual firing of the wafer, but instead adheres on the wafer, a matrix material is additionally present.

The matrix materials used are preferably water-soluble or water-dispersible polymers or polymer mixtures.

Preference is given to water-soluble or water-dispersible polymers or polymer mixtures which form low-viscosity solutions in water. This makes possible a high fill level on electrically conductive particles at low viscosity. Moreover, the polymers used should have a good adhesion to the substrate surface to be printed, for example in the production of solar cells of the surface of the solar wafer used. The polymers should also lead to a sufficient integrity of the printed conductor tracks.

Suitable polymers which can be used as matrix material are, for example, acrylate dispersions and acrylate copolymers, for example styrene acrylates, alkali-soluble acrylate resins and copolymers thereof, maleic anhydride copolymers, for example styrene-maleic acid dispersions, alkyd resin dispersions, styrene-butadiene dispersions, cellulose derivatives, especially hydroxyalkylcelluloses, carboxyalkylcelluloses, polyester dispersions, polyvinyl alcohols, especially partly or fully hydrolyzed polyvinyl alcohols, hydrolyzed vinyl acetate copolymers, for example grafted polyethylene glycol-vinyl acetate copolymers, polyvinylpyrrolidone and vinylpyrrolidone copolymers, polyethyleneimines, polyvinylamine, polyvinylformamide, hyperbranched polycarbonates, polyglycols, polyurethane dispersions, proteins, for example casein. It is also possible for mixtures of two or more polymers to form the matrix material.

In order to obtain good adhesion of the composition to the semiconductor material used as the substrate in the production of solar cells, a glass frit is present in the composition with a proportion in the range from 0 to 7% by weight. The proportion of glass frit is preferably in the range from 1.5 to 4% by weight and especially in the range from 2 to 3.5% by weight.

Preference is given to using essentially lead-free glass frits. Such glass frits are, for example, bismuth oxide-based glasses. Glass frits suitable for the composition comprise especially bismuth oxide, silicon oxide and/or tellurium oxide. The proportion of tellurium oxide is preferably in the range from 0.01 to 10% by weight. The proportion of bismuth oxide is preferably in the range from 40 to 95% by weight. The proportion of bismuth oxide is more preferably in the range from 50 to 80% by weight and especially in the range from 60 to 75% by weight. The proportion of silicon oxide is preferably in the range from 0 to 30% by weight, especially in the range from 1 to 4% by weight, based in each case on the mass of the glass frit.

In addition to bismuth oxide, silicon oxide and tellurium oxide, the glass frit may additionally comprise boron oxide. The proportion of boron oxide is preferably in the range from 0.1 to 10% by weight, especially in the range from 0.5 to 8% by weight and in a particularly preferred embodiment in the range from 1 to 4% by weight.

In addition to the oxides mentioned, the glass frit may comprise zinc oxide and/or aluminum oxide. The proportion of zinc oxide is in the range from 0 to 15% by weight and the proportion of aluminum oxide in the range from 0 to 3% by weight.

Further metal oxides which may be present in the glass frit are, for example, silver oxide ($Ag_2O$), antimony oxide ($Sb_2O_3$), germanium oxide ($GeO_2$), indium oxide ($In_2O_3$), phosphorus pentoxide ($P_2O_5$), vanadium pentoxide ($V_2O_5$), niobium pentoxide ($Nb_2O_5$) and tantalum pentoxide ($Ta_2O_5$). The proportion of $Ag_2O$, $P_2O_5$, $V_2O_5$, $Nb_2O_5$ and/or $Ta_2O_5$, which may be present in the glass frit is in each case in the range from about 0 to 8% by weight. The proportion of $In_2O_3$ and/or $Sb_2O_3$ in the glass frit is preferably in each case in the range from 0 to 5% by weight. In addition, the glass frit may comprise one or more alkali metal oxides, typically $Na_2O$, $Li_2O$ and/or $K_2O$. The proportion of alkali metal oxides in the glass frit is in each case in the range from 0 to 3% by weight. In addition, alkaline earth metal oxides may also be present in the glass frit. Alkaline earth metal oxides typically present are BaO, CaO, MgO and/or SrO. The proportion of alkaline earth metal oxides in the glass frit is in each case in the range from 0 to 8% by weight.

Essentially lead-free in the context of the present invention means that no lead is added to the glass frit and the proportion of lead in the glass frit is less than 1000 ppm.

The inventive composition further comprises at least one organometallic compound. The proportion of the organometallic compound in the composition is in the range from 0 to 5% by weight, preferably in the range from 1 to 3% by weight and especially in the range from 1.5 to 2.5% by weight.

In the course of firing of the substrate with the composition printed thereon, the organic constituent of the organometallic compound is decomposed and removed from the composition. The metal present remains in the composition and can additionally serve as an electrically conductive material.

Suitable organometallic compounds which can be used are metal carboxylates, metal propionate, metal alkoxides, complexes of a metal or a mixture thereof. The organometallic compounds may also comprise aromatic or aliphatic groups.

Suitable carboxylates are, for example, formates, acetates or propionates. Suitable alkoxides are, for example, methoxide, ethoxide, propoxide, butoxide, pentoxide, hexoxide, heptoxide, octoxide, nonoxide, decoxide, undecoxide and dodecoxide.

The metal of the organometallic compound is preferably selected from the group consisting of aluminum, bismuth, zinc and vanadium.

In addition, the organometallic compound may comprise boron or silicon.

Suitable organometallic compounds which can be used are, for example, bismuth(III) acetate, triphenylbismuth, bismuth (III) hexafluoropentanedionate, bismuth(III) tetramethylheptanedionate, bismuth neodecanoate, bismuth(III) 2-ethylhexanoate, bismuth carbonate oxide, bismuth subgallate hydrate, bismuth(III) gallate basic hydrate, bismuth(III) subsalicylate, bismuth(III) tris(2,2,6,6-tetramethyl-3,5-heptanedionate), triphenylbismuth(III) carbonate, tris(2-methoxyphenyl)bismuthine.

Especially preferred organometallic compounds are bismuth(III) acetate, bismuth(III) 2-ethylhexanoate, bismuth carbonate oxide, bismuth subgallate hydrate, bismuth(III) gallate basic hydrate, bismuth(III) subsalicylate.

In addition, the composition may also comprise further additives. Additives which may be present in the composition are, for example, dispersants, thixotropic agents, plasticizers, wetting agents, defoamers, desiccants, crosslinkers, complexing agents, conductive polymer particles and/or absorbents for laser radiation. The additives may each be used individually or as a mixture of two or more of the additives.

The proportion of the additives in the composition is generally in the range from 0 to 5% by weight, preferably in the range from 0.1 to 3% by weight and especially in the range from 0.1 to 2% by weight.

When a dispersant is used as an additive, it is possible to use only one dispersant or more than one dispersant.

In principle, all dispersants which are known to the person skilled in the art for use in dispersions and are described in the prior art are suitable. Preferred dispersants are surfactants or surfactant mixtures, for example anionic, cationic, amphoteric or nonionic surfactants. Suitable cationic and anionic surfactants are described, for example, in "Encyclopedia of Polymer Science and Technology", J. Wiley & Sons (1966), Volume 5, pages 816 to 818 and in "Emulsion Polymerisation and Emulsion Polymers", editors: P. Lovell and M. El-Asser, publisher: Wiley & Sons (1997), pages 224 to 226. However, it is also possible to use polymers with pigment-affinitive anchor groups, which are known to the person skilled in the art, as dispersants.

When thixotropic agents are added as an additive, it is possible, for example, to use organic thixotropic agents. Thickeners which can be used are, for example, polyacrylic acid, polyurethanes or hydrogenated castor oil.

Plasticizers, wetting agents, defoamers, desiccants, crosslinkers, complexing agents and conductive polymer particles which can be used are those as are typically used in dispersions and are known to the person skilled in the art.

If the composition is to be printed onto the substrate by a laser printing process, it is preferred when an absorbent for the energy of the energy source for the printing, for example of the laser, is added to the composition as a further additive. Depending on the laser beam source used, it may be necessary to use different absorbents or else mixtures of absorbents which effectively absorb the laser radiation.

Suitable absorbents for laser radiation have a high absorption in the range of the laser wavelength. Especially suitable are absorbents which have a high absorption in the near infrared and in the longer-wave VIS region of the electromagnetic spectrum. Such absorbents are especially suitable for absorbing radiation from high-power solid-state lasers, for example Nd:YAG lasers, and from IR diode lasers. Suitable absorbents for the laser radiation are, for example, dyes which absorb strongly in the infrared spectral region, such as phthalocyanines, naphthalocyanines, cyanines, quinones, metal complex dyes such as dithiolenes or photochromic dyes.

Further suitable absorbents are inorganic pigments, especially intensely colored inorganic pigments such as chromium oxides, iron oxides or iron oxide hydrates.

Likewise suitable as an absorbent is carbon in the form of, for example, carbon black, graphite, carbon nanotubes or graphenes.

When the absorbent used is carbon black, the proportion of carbon black in the composition is in the range from 0 to 5% by weight. The proportion is preferably in the range from 0.01 to 3% by weight and especially in the range from 0.5 to 2% by weight. The carbon black used may be any desired carbon black known to those skilled in the art. Such carbon blacks are known to the person skilled in the art and are commercially available.

In addition to the aforementioned absorbents, it is also possible to use nanoparticles of silver, gold, platinum, palladium, tungsten, nickel, tin, iron, indium tin oxide, tungsten oxide, titanium carbide or titanium nitride as absorbents for laser radiation. In this way, it is possible to dispense with elemental carbon, for example in the form of carbon black, carbon nanotubes, graphenes or graphite, as an absorbent for laser radiation, or to significantly reduce the amount required compared to known compositions.

A further advantage of the use of silver, gold, platinum, palladium, tungsten, nickel, tin, iron, indium tin oxide or titanium carbide is that these materials are electrically conductive. For this reason, the use of the nanoparticles lowers the electrical conductivity of the printed conductor tracks to a very much lower degree or preferably not at all. In addition, these materials are not oxidized in the course of firing; more particularly, they do not give rise to any gaseous compounds which can lead to porosity of the conductor tracks and hence to a lowering of the conductivity. Titanium carbide as an absorbent can burn, but the amount of carbon released is very much lower than the amount released in the case of use of elemental carbon as an absorbent.

In one embodiment, the nanoparticles are spherical particles. Spherical particles in the context of the present invention mean that the particles are essentially in spherical form, but the real particles may also have deviations from the ideal spherical form. For instance, the real particles may, for example, also be truncated or have a droplet shape. Other deviations from the ideal spherical shape, which can occur as a result of production, are also possible.

When the nanoparticles are spherical particles, they preferably have a diameter in the range from 2 to 100 nm. Especially in the case of use of infrared lasers, especially those with a wavelength of 1050 nm, it has been found that spherical nanoparticles with a particle diameter in the range from 2 to 50 nm are particularly suitable. The diameter of the spherical particles is more preferably in the region of 6 nm.

When the nanoparticles are used in the form of spherical particles, the proportion of the nanoparticles in the composition is especially in the range from 0.5 to 12% by weight.

In an alternative embodiment, the nanoparticles are prisms with an edge length in the range from 15 to 1000 nm and a height of 3 to 100 nm. The form of the prisms is variable. For instance, the form depends, among other factors, on the laser radiation used. The base of the prisms may, for example, be in the form of any polygon, for example of a triangle or of a pentagon. The prisms used as nanoparticles are generally Plasmon resonators whose absorption behavior is matched to the wavelength of the laser used. The matching to the wavelength of the laser used is effected, for example, by the edge length of the prisms and by the cross-sectional area. For example, different cross-sectional areas and different edge lengths each have a different absorption behavior. The height of the prisms also exerts an influence on the absorption behavior.

When prisms are used as nanoparticles, the proportion of the nanoparticles present as prisms in the composition is preferably in the range from 3 to 10% by weight.

In addition to the use of spherical particles or prisms as absorbents for laser radiation, it is alternatively also possible that both spherical particles and prisms are used. Any desired ratio of spherical particles to prisms is possible. The greater the proportion of nanoparticles in the form of prisms, the lower the proportion of nanoparticles in the composition may be.

The nanoparticles are generally stabilized in the course of production, especially for transport, by suitable additives. In the course of preparation of the composition for printing conductor tracks, the additives are typically not removed, such that they are then also present in the composition. The proportion of additives for stabilization is generally not more than 15% by weight, based on the mass of nanoparticles. The additives used to stabilize the nanoparticles may, for example, be long-chain amines, for example dodecylamine. Further additives suitable for stabilizing the nanoparticles are, for example, octylamine, decylamine, oleic acid and polyethyleneimines.

Very particularly suitable absorbents for laser radiation are inorganic pigments, nanoparticles of silver, gold, platinum, palladium, tungsten, nickel, tin, iron, indium tin oxide, tungsten oxide, titanium carbide or titanium nitride, especially of silver, fine carbon types or fine lanthanum hexaboride (LaB$_6$).

The amount of the absorbent added is selected by the person skilled in the art as a function of the desired properties of the dispersion layer. In this case, the person skilled in the art will additionally consider that the absorbent added influences not only the speed and efficiency of the transfer of the composition by the laser, but also influences other properties such as the adhesion of the composition on the substrate to be printed or the electrical conductivity of printed conductor tracks.

The inventive composition is prepared, for example, by vigorous mixing and dispersion in units known to the person skilled in the art. This includes, for example, the mixing of the components in a dissolver or a unit which disperses with comparable intensity, dispersion in a stirred ball mill or a powder fluidizer in the case of production of large amounts.

The inventive composition can be applied to a substrate by any process known to those skilled in the art. For example, coating with a printing process, for example screen printing, pad printing, inkjet printing, offset printing or laser printing, is possible. The layer thickness applied in the course of printing varies preferably within the range from 0.01 to 100 µm, further preferably between 0.1 and 50 µm and especially preferably in the range from 5 to 30 µm. The layers applied with the inventive composition may either be over the full surface or structured.

In a particularly preferred embodiment, the inventive composition is applied to the substrate by a printing process in which, by means of an energy-releasing device which releases energy in the form of electromagnetic waves, the composition experiences a change in volume and/or position and the composition is transferred to the substrate as a result. Such processes are known, for example, from WO-A 03/074278.

The invention claimed is:

1. A composition, comprising, by weight percent based on a total mass of the composition:
    50 to 90% of electrically conductive particles;
    0 to 7% of glass frit;
    0.1 to 5% of an absorbent, which absorbs laser radiation;
    0 to 8% of a matrix material;
    0 to 8% of an organometallic compound;
    3 to 50% of water, in the form of a solvent;
    0 to 65% of a retention aid; and
    0 to 5% of an additive,
    wherein the retention aid is a retardant that slows the evaporation of water, and the additive is at least one selected from the group consisting of a dispersant, a thixotropic agent, a plasticizer, a wetting agent, a defoamer, a desiccant, a crosslinker, a complexing agent, and conductive polymer particle,
    and wherein the electrically conductive particles comprise at least one selected from the group consisting of silver, gold, aluminum, platinum, palladium, tin, nickel, cadmium, gallium, indium, copper, zinc, iron, bismuth, cobalt, manganese, chromium, vanadium, and titanium.

2. The composition of claim 1, wherein the electrically conductive particles have a mean particle size in a range from 3 nm to 100 µm.

3. The composition of claim 1, wherein the electrically conductive particles are essentially spherical.

4. The composition of claim 1, wherein the glass frit is a bismuth oxide-based, lead-free glass.

5. The composition of claim 4, wherein the glass frit comprises 0.01 to 10% by weight of tellurium oxide based on a total mass of the glass frit.

6. The composition of claim 1, wherein the matrix material is a water-soluble or water-dispersible polymer.

7. The composition of claim 1, wherein the retention aid is at least one selected from the group consisting of glycerol, a glycol, a polyglycol, an alkanolamine, N-methylpyrrolidone, a polyethyleneimine, a polyvinylamine, and a polyvinylformamide.

8. The composition of claim 1, wherein the organometallic compound is at least one selected from the group consisting of a metal carboxylate, a metal propionate, a metal alkoxide, and a metal complex.

9. The composition of claim 1, wherein the metal of the organometallic compound is selected from the group consisting of aluminum, bismuth, zinc, and vanadium.

10. The composition of claim 1, wherein the organometallic compound further comprises boron or silicon.

11. The composition of claim 1, wherein the absorbent is (i) inorganic pigments, (ii) nanoparticles comprising silver, gold, platinum, palladium, tungsten, nickel, tin, iron, indium tin oxide, tungsten oxide, titanium carbide, or titanium nitride, (iii) fine carbon, or (iv) fine lanthanum hexaboride.

12. The composition of claim 11, wherein the fine carbon comprises at least one selected from the group consisting of carbon black, graphite, carbon nanotubes, and graphenes.

13. A process for producing a solar cell electrode, the process comprising:
    contacting the composition of claim 1 and a solar cell substrate, thereby obtaining a solar cell electrode.

14. The composition of claim 2, wherein the electrically conductive particles are essentially spherical.

15. The composition of claim 1, wherein the matrix material is present in the composition, and the matrix material is a water-soluble polymer.

16. The composition of claim 1, wherein the matrix material is present in the composition, and the matrix material is a water-dispersible polymer.

17. The composition of claim 4, comprising from 1.5 to 4% by weight of the glass frit, based on a total mass of the composition.

18. The composition of claim 9, comprising from 1-3% by weight of the organometallic compound, based on a total mass of the composition.

19. The composition of claim 7, comprising from 0.5-10% of the retention aid, based on a total mass of the composition.

* * * * *